(12) United States Patent
Blanchet-Fincher

(10) Patent No.: US 7,316,874 B2
(45) Date of Patent: Jan. 8, 2008

(54) PROCESS AND DONOR ELEMENTS FOR TRANSFERRING THERMALLY SENSITIVE MATERIALS TO SUBSTRATES BY THERMAL IMAGING

(75) Inventor: Graciela Beatriz Blanchet-Fincher, Greenville, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/807,363

(22) Filed: Mar. 23, 2004

(65) Prior Publication Data

US 2005/0214672 A1 Sep. 29, 2005

(51) Int. Cl.
G03C 5/54 (2006.01)
G03F 7/34 (2006.01)

(52) U.S. Cl. .......................... 430/11; 430/14; 430/200; 430/201; 430/270.1; 430/271.1; 430/273.1; 430/945; 430/964

(58) Field of Classification Search .................. 430/11, 430/14, 200, 201, 271.1, 273.1, 275.1, 278.1, 430/944, 945
See application file for complete search history.

(56) References Cited

U.S. PATENT DOCUMENTS

| | | | |
|---|---|---|---|
| 4,643,917 A | 2/1987 | Koshizuka et al. | |
| 4,942,141 A | 7/1990 | DeBoer et al. | |
| 4,948,776 A | 8/1990 | Evans et al. | |
| 5,019,549 A | 5/1991 | Kellogg et al. | |
| 5,156,938 A | 10/1992 | Foley et al. | |
| 5,171,650 A | 12/1992 | Ellis et al. | |
| 5,937,272 A | 8/1999 | Tang | |
| 6,143,451 A * | 11/2000 | Blanchet-Fincher | 430/11 |
| 6,221,553 B1 * | 4/2001 | Wolk et al. | 430/200 |
| 6,358,664 B1 | 3/2002 | Nirmal et al. | |
| 6,818,363 B2 * | 11/2004 | Fincher et al. | 430/11 |
| 2002/0054201 A1 | 5/2002 | Takeda et al. | |
| 2002/0158574 A1 | 10/2002 | Wolk et al. | |

FOREIGN PATENT DOCUMENTS

| | | |
|---|---|---|
| GB | 2083 726 | 3/1982 |
| WO | WO 99/43031 | 8/1999 |

OTHER PUBLICATIONS

Product information from www.arkema-inc.com/index.cfm?act=businessunit$cat=1.*

(Continued)

Primary Examiner—Amanda C. Walke

(57) ABSTRACT

Methods of forming a patterned semiconducting-dielectric material on a substrate by thermal processes are disclosed, comprising heating a thermally imageable donor element comprising a substrate and a transfer layer of semiconductive material in conjunction with a dielectric. The donor is exposed with the positive image of the desired pattern to be formed on the receiver, such that the exposed portions of the layer of semiconductive and dielectric material are simultaneously transferred, forming the desired pattern of semiconductive and dielectric material on the receiver. The semiconducting material can be patterned to form a thin film transistor. The method can also be used to pattern a light-emitting polymer or small molecule in conjunction with the charge injection layer to form the light-emitting display for light-sensitive organic electronic devices. Donor elements for use in the process are also disclosed. Methods for forming thin film transistors and donor elements for use in the processes, are also disclosed.

27 Claims, 3 Drawing Sheets

OTHER PUBLICATIONS

Wikipedia entry for "Acrylic Reins" from Wikipedia.com*
Garnier, Francis, et al., "All-Polymer Field Effect Transistor Realized by Printing Techniques", Science, vol. 265, Sep. 16, 1994, France.

Z. Bao, et al., "High-Performance Plastic Transistors Fabricated by Printing Techniques", Chem. Mater. 1997, vol. 9, pp. 1299-1301, New Jersey.

* cited by examiner

PROCESS AND DONOR ELEMENTS FOR TRANSFERRING THERMALLY SENSITIVE MATERIALS TO SUBSTRATES BY THERMAL IMAGING

FIELD OF THE INVENTION

This invention relates to processes for transferring fragile or thermally sensitive materials by a thermal imaging process. This invention also relates to multi-layered structures useful in carrying out such processes. These processes include forming patterns of light-emitting polymers or semiconductive-dielectric material on substrates by laser-induced thermal transfer imaging. The invention relates to methods for forming thin film organic transistors (TFTs) and polymer light-emitting displays (PLEDs) by such thermal processes.

TECHNICAL BACKGROUND OF THE INVENTION

Thin film transistors have been fabricated incorporating organic semiconducting materials, such as pentacene, polythieneylenevinylene, thiophene oligomers, benzothiophene dimers, and polyacetylenes. Organic materials can also be used to form the other components of the transistor, such as the conducting layers that form the gate, source, and drain electrodes, and the insulating layers that form the dielectric.

Transistors made in whole or in part of organic materials may be less expensive and easier to manufacture than traditional transistors. While the same component densities as silicon transistors have not yet been achieved, the low cost of organic transistors means that they can be used in applications where high density is not required and traditional transistors are not economical. For example, organic transistors could be used in inexpensive or disposable items, such as electronic paper, posters and books, smart cards, toys, appliances and electronic bar codes for product identification. Organic transistors can also be flexible, which is advantageous in certain applications. For example, flexible transistor arrays can be used in flexible electrophoretic displays, PLEDs and liquid crystal displays (LCDs) for computers, laptops and televisions. While the savings in fabrication costs are significant, further decreases in the fabrication costs of organic transistors would be advantageous.

Organic materials can be applied to a portion of a transistor by spin coating, casting, printing or other methods. Some organic materials can also be applied by physical vapor deposition processes. An electroactive polymer precursor can also be applied and converted to a polymer, typically by heat. Using a mask can provide direct patterning during deposition. If a photoresist is used during deposition, wet chemical etching after deposition is necessary, which may result in severe degradation of the organic semiconductor. While easier and less expensive than the fabrication techniques required by silicon based transistors, such methods are still complex, slow, lack sufficient resolution, expose the device to deleterious heat and chemical processes, and are more expensive than necessary.

Fabricating organic transistors completely by printing techniques offers the potential for further cost reductions. F. Gamier et al., "All-Polymer Field-Effect Transistor Realized by Printing Techniques", *Science*, Vol. 265, 16 Sep. 1994, pp.1684-1686, disclose the formation of a transistor by deposition of a conducting graphite-based polymer ink through masks to form gate, source and drain electrodes. Semiconducting material of $\alpha,\omega$-di(hexyl)sexithiophene was deposited over the source and drain by flash evaporation.

Z. Bao, et al., "High-Performance Plastic Transistors Fabricated by Printing Techniques," *Chem. Mater.* 1997, 9, 1299-1301, disclose the production of a high-performance transistor in which the essential components were printed directly on an indium tin oxide (ITO) coated plastic substrate. Masks were used to form the printed patterns of the transistor components.

Ink-jet printing has also been used to apply organic semiconducting material. See U.S. Pat. No. 6,087,196; EP 0880303A1; WO 99/66483; and WO 99/43031. While facilitating the fabrication process, screen-printing and ink-jet printing do not provide sufficient resolution for certain applications. In addition, it is also difficult to control the flatness and uniformity of the final film in ink-jet printing processes.

Thermal transfer processes are well known in applications such as color proofing. Such thermal transfer processes include, for example, dye sublimation, dye transfer, melt transfer, and ablative material transfer, and typically use a laser to induce the imagewise thermal transfer of material. These processes have been described in U.K. 2,083,726; U.S. Pat. Nos. 4,942,141; 5,019,549; 4,948,776; 5,156,938; 5,171,650; and 4,643,917.

Laser-induced thermal transfer processes typically use a donor element, including a layer of material to be transferred ("transfer layer"), and a receiver element, including a surface for receiving the transferred material. Either the substrate of the donor element or the receiver element is transparent, or both are transparent. The donor element and receiver element are brought into close proximity or into contact with each other and selectively exposed to laser radiation, usually by an infrared laser. Heat is generated in the exposed portions of the transfer layer, causing the transfer of those portions of the transfer layer onto the surface of the receiver element. If the material of the transfer layer does not absorb the incoming laser radiation, the donor element must include a heating layer adjacent to the transfer layer. An ejection layer of a vaporizable polymeric material, which decomposes into gaseous molecules when heated, may be also provided between the heating layer and the donor support. Decomposition of the ejection layer provides additional force for propelling the exposed portions of the transfer layer onto the receiver element.

In one laser-induced digital thermal transfer process, the exposure takes place only in a small, selected region of the assembly at a time, so that transfer of material from the donor element to the receiver element can be built up one pixel at a time. Computer control facilitates the transfer at high speed and high resolution. Alternatively, in an analog process, the entire assembly is irradiated and a mask is used to selectively expose desired portions of the thermally imageable layer (U.S. Pat. No. 5,937,272).

Laser-induced thermal transfer processes are generally faster and less expensive than the coating, deposition and patterning processes described above and allow the patterning of features at high resolution. Although printing an item in a printing press offers high speed, large-area printing and high resolution, a laser-induced thermal process has the additional advantage of not requiring solvent compatibility of layers printed sequentially, thereby broadening the range of useable materials. However, direct thermal printing of extremely thin films of semiconductors or light-emitting organic materials that are fragile and sensitive to perturbations (e.g., large temperature gradients, humidity, pressure or mechanical stress) has not been achieved. Attempts to thermal transfer materials such as pentacene, fluorinated copper phthalocyanine, or organic light-emitting materials usually results in severe degradation and/or partial vaporization of the materials.

There is a need for thermal transfer processes, particularly laser-induced thermal transfer processes, that can be used in the application and patterning of organic semiconducting materials for the fabrication of organic transistors and other organic electronic devices, and of light-emitting materials for the fabrication of light-emitting devices such as displays.

SUMMARY OF THE INVENTION

The process of this invention provides a method for transferring fragile or thermally sensitive materials using a thermal imaging process. The process of this invention comprises:
  a. forming a donor element comprising:
    i. a substrate; and
    ii. a transfer layer comprising a fragile or thermally-sensitive material and a protective layer located between the substrate and the fragile or thermally-sensitive layer;
  b. placing the transfer layer of the donor element in contact with a receiver element; and
  c. exposing selected areas of the donor element to laser radiation to transfer portions of the transfer layer onto a receiver element to form a patterned multilayer structure.

This invention also provides a thermally imageable donor element, comprising:
  a. a substrate;
  b. a heating layer;
  c. a protective layer; and
  d. a fragile or thermally sensitive layer.

The process and donor element of this invention are useful in the manufacture of thin film transistors and polymer light-emitting displays.

DETAILED DESCRIPTION OF THE INVENTION

Figure 1:
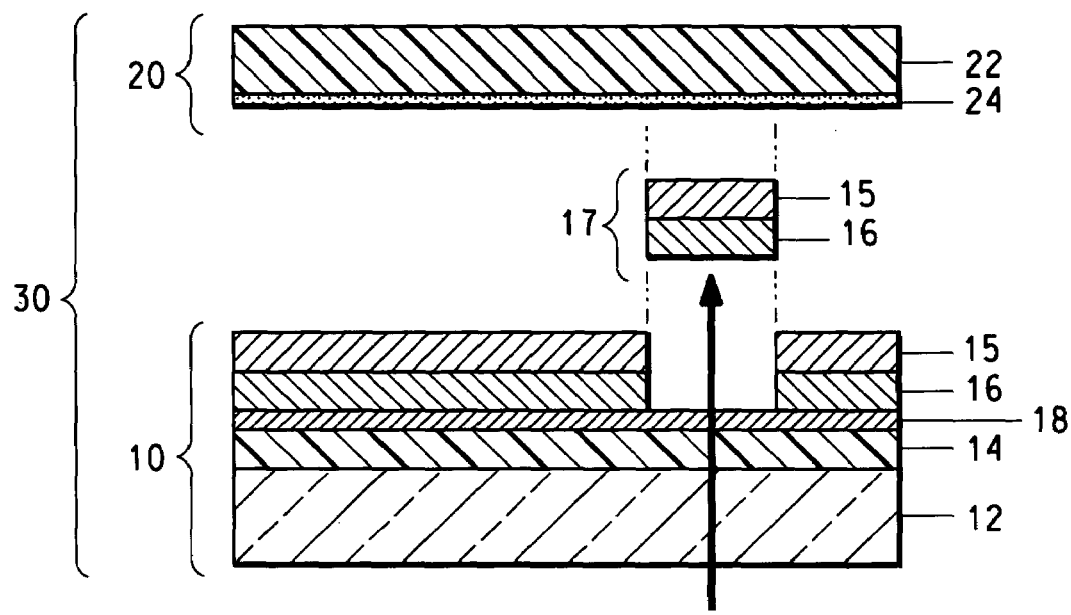
FIG. 1 is a side view of a thermally imaged transistor.

As used herein, the term "organic electronic device" refers to an electronic device in which any component, such as a semiconducting, conducting or light-sensitive component, is an organic material.

Also as used herein, the phrase "adjacent to" does not necessarily mean that one layer is immediately next to another layer. An intermediate layer or layers may be provided between layers said to be adjacent to each other.

The process of this invention provides a method for transferring thermally-sensitive or fragile materials from a donor element to a receiver element via thermal imaging. This process is especially useful for manufacturing organic electronic devices, e.g., TFTs and PLEDs. The fragile or thermally-sensitive materials are incorporated into the transfer layer of the donor element, and are protected from the heat generated in the thermal transfer process by a protective layer. Examples of fragile or thermally-sensitive materials of particular interest are organic or inorganic semi-conductors, light-emitting polymers and small molecule light-emitters, but the process can also be used to transfer more robust materials. The protective layer can comprise material that is also useful in constructing electronic devices. Dielectrics and charge injection materials are preferred protective layers in the manufacture for TFTs and PLEDs, respectively. The process of this invention can also be used to transfer one or more electroactive layers simultaneously, resulting in both process simplification and improved registration fidelity in manufacturing multilayer electronic device structures.

In one embodiment of the present invention, a thermal imaging process is disclosed for forming patterns of semi-conductive material (e.g., p- or n-type organic or inorganic semiconductor) and a dielectric material, in which the materials are simultaneously transferred onto a patterned or unpatterned receiver to form a multilayer structure. The multilayer structure can be used in an electronic device, including an organic electronic device. For example, the semiconducting and dielectric layers can be thermally transferred by the process of this invention onto a source and drain which have previously been deposited on a receiver substrate, and then a gate layer can be printed on top of the transferred semiconducting and dielectric layers to form a "bottom contact thin film transistor." In a preferred embodiment of this process, the donor element comprises a flexible substrate, a heating layer coated with a dielectric layer, and a semiconducting layer on top of the dielectric layer. When thermal imaging such a donor, the semiconducting layer is transferred directly onto the source (112) and drain (114), and the dielectric (118) is simultaneously transferred with the semiconducting layer (116), in the same pattern and without disruption of the semiconductor-dielectric interface. An additional dielectric layer can be transferred by thermal imaging or other techniques to cover any irregularities of the first dielectric layer. A gate layer (120) can be printed onto the dielectric layer(s) via thermal imaging or conventional methods to complete the fabrication of a transistor in a bottom-contact configuration. (See FIG. 2.)

Alternatively, in a "top contact" configuration, the gate would be printed on the receiver, and then the dielectric would be printed on the gate, either by thermal imaging or other printing method. The semi-conductive layer is deposited next, and finally the source and drain are applied on top of the semi-conductive layer, either by thermal transfer or other printing methods.

The imaging process of this invention can pattern multiple layers of dielectric in addition to the semiconducting-dielectric layer, as long as the pattern for each of the multiple layers is the same. Sequential dielectric layers can be applied for electrical isolation.

A negative-imaging mode can also be used to simultaneously pattern one or more layers. In the negative imaging mode, regions outside the desired pattern are removed by laser ablation or other means to form a patterned layer (e.g., a semiconducting layer, a dielectric layer or a dielectric+ semiconducting layer). The patterned layer(s) can then be laminated in registry onto printed source and drains or other components of the desired electronic device. Such a negative-imaging process can also be used in conjunction with the process of this invention to form electronic devices.

A thin film transistor incorporating an organic semiconductor can be made by forming patterned dielectric and organic semiconducting layers on a donor via negative imaging. The patterned dielectric and organic semiconducting layers are then deposited over the source and drain via lamination, followed by deposition of the gate.

In a different transistor configuration, a pattern of dielectric material can be directly transferred via thermal transfer onto the gate layer. The printing of the source and drain follows the transfer of the dielectric layer. The organic semiconducting material with a protective layer is then transferred via the process of this invention onto the source and drain layer, followed by deposition of the gate.

In another embodiment of this invention, a thermal transfer process is disclosed for forming patterns of light-emitting polymer (or small molecule emitters) and a charge-injection material, in which the polymer and charge-injection material are simultaneously transferred onto a receiver element. In this process, the donor element comprises a substrate, a layer of charge-injection material adjacent to the substrate, and a layer of light-emitting polymer (or small molecule emitters) adjacent to the charge-injection layer. The donor element can also contain a heating layer between the substrate and the charge-injection layer, as well as an optional ejection layer between the substrate and the heating layer. In this process, the charge-injection layer serves as the protective layer, protecting the sensitive light-emitting polymer (or small molecule emitters) from direct exposure to the heat generated by the laser beam, and allowing the direct transfer of organic light-emitting polymers and small molecule light-emitters without degradation. This process also eliminates the tedious lamination step that is necessary if the light-emitter/charge injection pattern is created by negative imaging. This process of this invention enables the fabrication of low-cost, multi-color, light-emitting displays. In this embodiment, the use of light-emitting polymers is preferred.

To form the desired pattern of semiconductive and dielectric material on a receiver in accordance with a preferred embodiment of the present invention, a thermally imageable donor element (10) is provided. The donor element comprises a substrate (12), an optional ejection layer (14), a heating layer (18), and a transfer layer comprising a dielectric layer (16) and a semiconducting layer (15), as shown in FIG. 1. FIG. 1 also shows a receiver element (20) comprising a base element (22) and an optional adhesive layer (24). The exposed portion of the transfer layer (17) is transferred onto the receiver element.

The substrate (12) is a material suitable for use in an electronic device. The substrate (12) is preferably flexible and transparent, to facilitate the exposure of the donor element (10) by laser radiation, as described further, below. Suitable transparent films include polyesters (most preferably polyethylene terephthalate), polyether sulfone, polyvinyl chloride, polyimides, poly(vinyl alcohol-co-acetal), polyethylenes, and cellulose esters, such as cellulose acetate.

Suitable dielectrics include polyhydroxystyrene, polyvinylpyridine, polyvinylphenol, glass resin, flurorinated copolymers, and methacrylic copolymers.

Suitable organic semiconducting materials include pentacene, sexithiophene, tetracene, polythieneylenevinylene, thiophene oligomers, benzothiophene dimers, and polyacetylenes. Suitable inorganic semiconducting materials include $ZnO_2$, CdS and amorphous silicon.

An ejection layer can also be provided between the substrate and the heating layer. The ejection layer (14) comprises a material with a low decomposition temperature, preferably less than about 275° C. The ejection layer is preferably non-metallic. Suitable materials include nitrocellulose, polyvinyl chloride, chlorinated polyvinyl chloride, polymethylmethacrylate and polymethacrylate copolymers. The ejection layer is typically about 1 micron thick.

The ejection layer (14) may also contain a radiation-absorbing dye dissolved in the low decomposition temperature binder. The absorbing dye absorbs radiation in the emission band of the exposure laser. Typically, the exposure laser emits radiation in the infrared range and the absorbing dye is an infrared-absorbing dye. A suitable infrared absorbing dye is TIC-5c (2-[2-[2-chloro-3[[1,3-dihydro-1,3,3-trimethyl-2H-indol-2-ylidene) ethylidene]-1-cyclopenten-1-yl]ethenyl]-1,3,3-trimethyl-3-H-indolium, salt with trifluoromethane sulfonic acid (1:1), CAS # 128433-68-1), available from E. I. DuPont de Nemours, Inc. (Wilmington, Del.). Alternative dyes which absorb at 830 nm include ADS 830 (2-[2-[2-chloro-3-[2-[1,3-dihydro-1,1-dimethyl-3-(4-sulfobutyl)-2H-benz[e]indol-2-ylidene]ethylidene]-1-cyclohexen-1-yl]ethenyl]-1,1-dimethyl-3-(4-sulfobutyl)-1H-benz[e]indolium, inner salt, free acid, CAS # 162411-28-1); and SQS ((4-[[3-[[2,6-bis(1,1-dimethylethyl)-4H-thiopyran-4-ylidene]methyl]-2-hydroxy-4-oxo-2-cyclobuten-1-ylidene] methyl]-2,6-bis(1,1-dimethylethyl)-thiopyrylium, hydroxide, inner salt, CAS # 88878-49-3, also available from E. I. DuPont de Nemours, Inc. (Wilmington, Del.). The laser may emit in other wavelength bands, and then dyes are chosen that absorb radiation in that particular wavelength band.

The dielectric layer may also contain small amounts of dyes to absorb laser radiation such as the dyes listed above.

Gas formers may also be included in the ejection layer (14) to increase the propulsive force generated in the ejection layer. Suitable gas formers include: diazo alkyls; diazonium salts; azido ($-N_3$) compounds; ammonium salts; oxides, which decompose to form oxygen; carbonates; and peroxides. Diazo compounds such as 4-diazo-N,N' diethylaniline fluoroborate, may be used, for example. Mixtures of gas formers can also be used.

The heating layer (18) is preferably a thin metal layer that absorbs the incoming radiation. The metal is preferably Ni, Al, V or Cr, with a thickness such that the layer exhibits maximum absorption of the incoming laser beam (25-35%). Ni layers of 30-150 Å are preferred.

The transfer layer of semiconducting (15) and dielectric (16) material may comprise organic semiconducting materials deposited via evaporation or solution onto a suitable dielectric. Suitable dielectric layers for organic transistors include materials with high dielectric constant. The capacitance of the dielectric layers is typically at least $10^{-8}$ $F/cm^2$. In addition, the dielectric layers must provide suitable interfaces for the evaporated semiconductors such that their grain size, and therefore field-effect mobility, is large.

The receiver element (20) comprises a substrate (22) and an optional adhesive layer (24). The substrate (22) is a dimensionally stable sheet material. Suitable sheet materials include transparent films of polyethylene terephthalate, polyether sulfone, polyimide, poly (vinyl alcohol-co-acetal), polyethylene or a cellulose ester, such as cellulose acetate. The receiver substrate can also be an opaque material, such as polyethylene terephthalate filled with a white pigment such as titanium dioxide; ivory paper; or synthetic paper, such as Tyvek® spunbonded polyolefin.

The adhesive layer (24) of the receiver element (20) can be any low Tg polymer. Suitable adhesive materials include polycarbonates; polyurethanes; polyesters; polyvinyl chloride; styrene/acrylonitrile copolymers; poly(caprolactone); vinylacetate copolymers with ethylene and/or vinyl chloride; (meth)acrylate homopolymers (such as butyl-methacrylate) and copolymers; and mixtures thereof. Pressure-sensitive adhesives can also be used.

In the process of the present invention, the donor element (10) of FIG. 1 and the receiver element (20) are brought into contact to form an assembly (30). The outer surface of the transfer layer (17) is in contact with the adhesive coating (24), if present. If the adhesive coating (24) is not present, then the outer surface of the transfer layer (17) contacts the receiver substrate (22).

Vacuum and/or pressure can be used to hold the donor element (10) and the receiver element (20) together to form the assembly (30). In one embodiment, the donor element (10) and the receiver element (20) can be held together by fusion of layers at the periphery of the assembly. In another embodiment, the donor element (10) and receiver element (20) can be taped together, and then taped to the imaging apparatus. A pin/clamping system can also be used. In yet another embodiment, the donor element can be laminated to the receiver element. If the donor element (10) and the receiver element (20) are flexible, the assembly (30) can be conveniently mounted on a drum to facilitate laser imaging.

The assembly (30) is selectively exposed to laser radiation (R), in an exposure pattern of the desired pattern to be formed on the substrate. (See FIG. 1). The laser radiation or laser beam (R) is focused on portions of the interface between the dielectric layer (16) and the heating layer (18). The exposed portions of the dielectric layer (16) heat the adjacent portions of the ejection layer (14), causing decomposition and vaporization of the ejection layer (14), propelling the exposed portions of the transfer layer (17) onto the receiver. The desired portions of the transfer layer (17) of dielectric (16) and semiconducting material (15) are thereby transferred to the receiver element (20), leaving the unwanted pattern of material on the substrate (12).

After exposure, the donor element (10) and receiver element (20) are separated, leaving the unwanted portions of a the dielectric (16) and semiconducting (15) layers on the substrate (12) and the imaged portions of the transfer layer (17) on the receiver element (20). The resulting multilayer structure may then be further processed to form the desired organic electronic device. For example, an organic, thin film transistor of organic semiconducting material can be fabricated using the process of this invention.

The radiation is preferably applied through the substrate element (12), as shown in FIG. 1. Laser radiation may be provided at a laser fluence of up to about 600 mJ/cm$^2$, preferably about 75-440 mJ/cm$^2$. Various types of lasers can be used to expose the transfer layer (17). The laser preferably emits in the infrared, near-infrared or visible region. Particularly advantageous are diode lasers emitting in the region of 750 to 870 nm, due to their small size, low cost, stability, reliability, ruggedness and ease of modulation. Diode lasers emitting in the range of 780 to 850 nm are most preferred. Such lasers are available from Spectra Diode Laboratories (San Jose, Calif.). Other types of lasers, and lasers that emit in other wavelength bands, can be used as well.

The process of the present invention can also be used as a thermal imaging process to transfer layers of material as thin as about 100 Å-150 Å, by providing a protective layer that is directly exposed to the heat generated in the transfer process. Thicker layers can also be transferred (i.e., greater than 150 Å).

Figure 2:
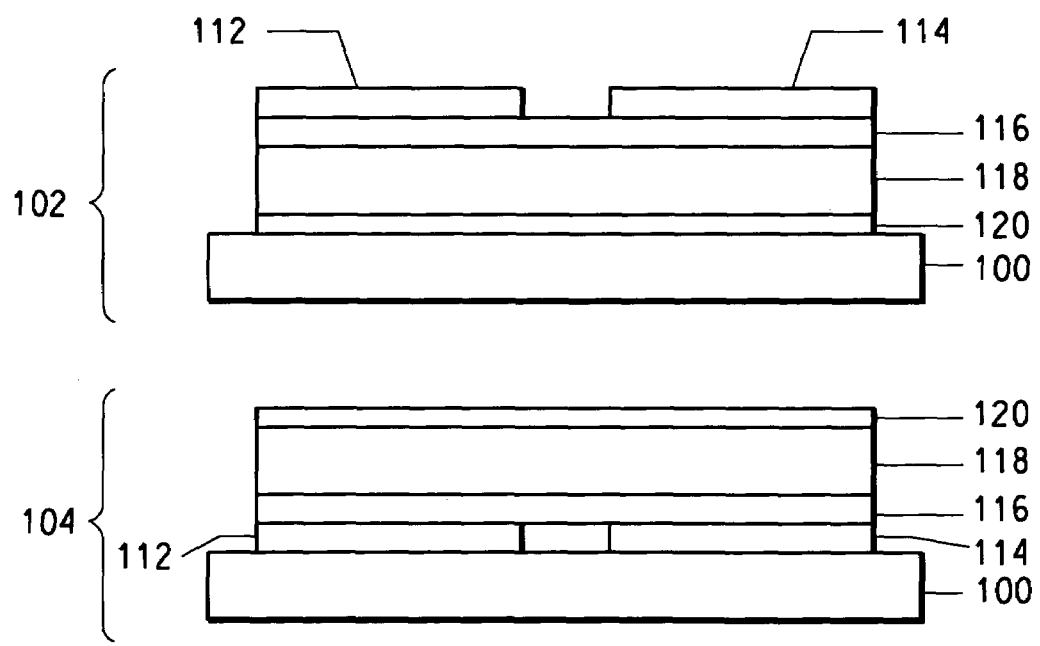
FIG. 2 is a side view of a top contact thin film transistor and a bottom contact thin film transistor.

FIG. 2 shows a side view of a bottom contact configuration of a thin film polymeric transistor (104) fabricated on a substrate (100). The transistor (104) comprises: a source (112) and a drain (114) on a substrate (100); organic semiconducting material (116) over each source (112) and drain (114); a layer of dielectric material (118) over the organic semiconducting material, forming an insulating layer; and a layer of conducting material over the insulating layer (118), forming a gate electrode (120).

FIG. 2 also shows a TFT (102) in a top-contact (bottom-gate) configuration. This TFT comprises: a gate electrode (120) over a substrate (100); a layer of dielectric material (118) over the gate layer; a source (112) and drain (114) over the dielectric; a semiconducting layer (116) over the source (112) and drain (114); and an additional dielectric layer which serves as an encapsulating layer (119, not shown in this Figure). In the top contact TFT configuration (102), after formation of the desired gate pattern (120), the dielectric layer (118) is applied either by thermal imaging, or alternative methods, followed by deposition of the semi-conducting layer (116). A set of sources (112) and drains (114) is applied on top of the pattern of organic semiconducting material (116). The encapsulating layer (119) is applied over the sources (112) and drains (114). In the top contact configuration, the second dielectric layer (the encapsulating layer (119)) acts as a barrier layer, as well as in assisting transferring the semiconducting layer without degradation. If the gate electrode (118), source (112) and drain (114) are connected to potential, current will flow from the source (112) through the organic semiconducting material (116) to the drain (114) when the gate electrode (118) is turned on.

The gap between the source (112) and the drain (114) may be as small as one pixel (5 microns) if produced via thermal imaging. The thickness of the source (112) and drain (114) can be about 100 Å to about 10,000 Å. The thickness of the dielectric layer (118) can be about 100 Å to about 15,000 Å. The thickness of the semiconducting layer (116) can be about 50 Å to about 2000 Å if deposited via thermal evaporation and up to 10,000 Å if cast from solution. In the bottom-contact TFT, a pattern of organic semiconducting and dielectric materials is applied over the sources (112) and drains (114).

Figure 3:
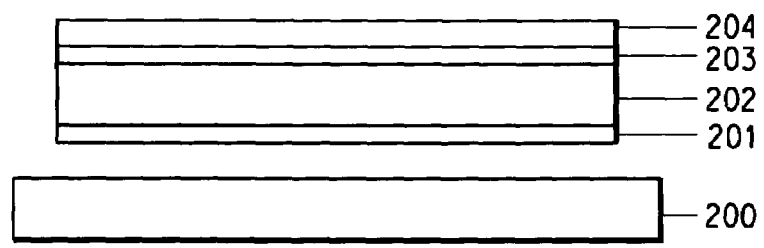
FIG. 3 is a side view of a polymer light-emitting diode (PLED).

The process of the present invention can be used to fabricate a polymer light-emitting display. FIG. 3 shows a side view of a PLED. A flexible substrate (200) is coated with ITO, which constitutes the anode (201) of the display. The charge injection layer (202) and the light-emitting polymer (203) are coated on top.

EXAMPLES

The non-limiting examples demonstrate the processes for the transfer of thin dielectric and semiconducting layers, claimed and described herein. The amounts below are given as wt %. The CREO unit comprised an 81.2 cm long drum with a 91 cm perimeter. The CREO 3244 Spectrum Trendsetter Exposure Unit (available from Creo-Scitex, Inc., Vancouver, Canada) included a 20 watt infrared diode laser, which emitted a laser beam at 830 nm at 1 microsecond pulse width. The laser beam was split by a light valve to form an array of 240 overlapping 5 micron×2 micron spots. GMA is glycidyl methyl acrylate; MMA is methyl methacrylate; BA is butyl acrylate; and MAA is methacrylic acid.

Example 1

The TFT in bottom contact configuration described in the following example was printed via thermal imaging using four donor elements. Each of the donor elements included a 4 mil (0.0363 mm) thick substrate of Mylar®, 400 D optical clarity, available from E. I. DuPont de Nemours, Inc. (Wilmington, Del.) coated with 100 Å of nickel by electron beam deposition, to about 40% optical transmission.

The polyaniline (PANI) used was prepared through emulsion polymerization following the procedure outlined in U.S. Pat. No. 5,863,465. Dinonylnaphthalene sulfonic acid (DNNSA) was used as the dopant. The doped PANI is hereafter referred to as PANI-DNNSA. The addition of DNNSA was controlled such that the moles of sulfur atoms from the acid equaled the moles of nitrogen atoms in the backbone of the PANI. This was confirmed by elemental analysis after washing, separating and drying the resulting PANI-DNNSA. Carbon nanotubes were dispersed in PANI-DNNSA using an acoustic Dukane sonicator with a horn probe using the following procedure. Laser carbon nanotubes, 59 mg, (CNI, Houston, Tex.) and 19.03 g xylenes were mixed in a 2 oz. bottle. The mix was dispersed for 10 minutes with the horn probe submerged in the mix at a depth such that a stable mixing vortex was observed. PANI-DNNSA (5.9 g, 32.9% solids in xylenes) was added to the nanotube/xylene mixture. The resulting mixture was dispersed for an additional 5 minutes, during which time the bottle was shaken two times in order to rinse the carbon nanotubes off the walls of the bottle. The DNNSA-PANI/SWNT solution was coated to 1.2 micron in thickness onto the electron-beam deposited Ni layer using a # 10 Meyer rod. The film contained 3 wt % NT and 97 wt % polyaniline after drying. The DNNSA-PANI/SWNT donor elements were used for the printing the gates and source and drains.

The donor element for the dielectric-semiconducting layer was prepared by coating poly-vinyl pyrelene to 1.1 micron in thickness on a Ni-coated Mylar® film. Pentacene (Sigma-Aldrich, Milwaukee, Wis.) was then evaporated onto the dielectric-semiconducting layer using a Kurt Lesker evaporator. The pentacene film was evaporated at room temperature at a rate of 0.3 Å over a 6"×6" area. The thickness of the pentacene layer was 250 Å, as measured using a quartz crystal. The 3"×3" backplane was printed as follows.

The DNNSA-PANI/SWNT donor element and the receiver element were loaded onto a CREO 3244 Spectrum Trendsetter Exposure Unit. The receiver element was a 4 mil Mylar® film coated with a 1.4 micron film obtained from a GMA 2%/MMA 51%/BA 40%/MAA 3% latex (33 wt % solids), with a glass transition of 39° C.

The source and drain layer was printed at a laser fluence of 3.45 Watts and the drum speed was maintained at 100 RPM. The laser beam was focused at the interface between the layer of nickel and DNNSA-PANI/SWNT. The nickel absorbed the incoming laser beam, partially decomposing the organics at its interface, and the gaseous decomposition products propelled the exposed portions of the DNNSA-PANI/SWNT conducting layer onto the receiver element. After formation of the source and drains were completed, the semiconductor-dielectric donor was loaded onto the 3244 Trendsetter in place of the DNNSA-PANI/SWNT donor element. The semiconductor-dielectric donor element was exposed at 7 Watts. Registration to the pixel level was maintained after removal and repositioning the different donor elements. Since the glass transition of the coating on the receiver element was low, it was sufficiently tacky for the transferred semiconducting surface to adhere to the receiver element.

Finally, the gates were printed on top of the transferred dielectric layer using the DNSSA-PANI/SWNT donor element previously described in the printing of the source and drains. The gate layer was exposed at 3.6 Watts.

Figure 4:
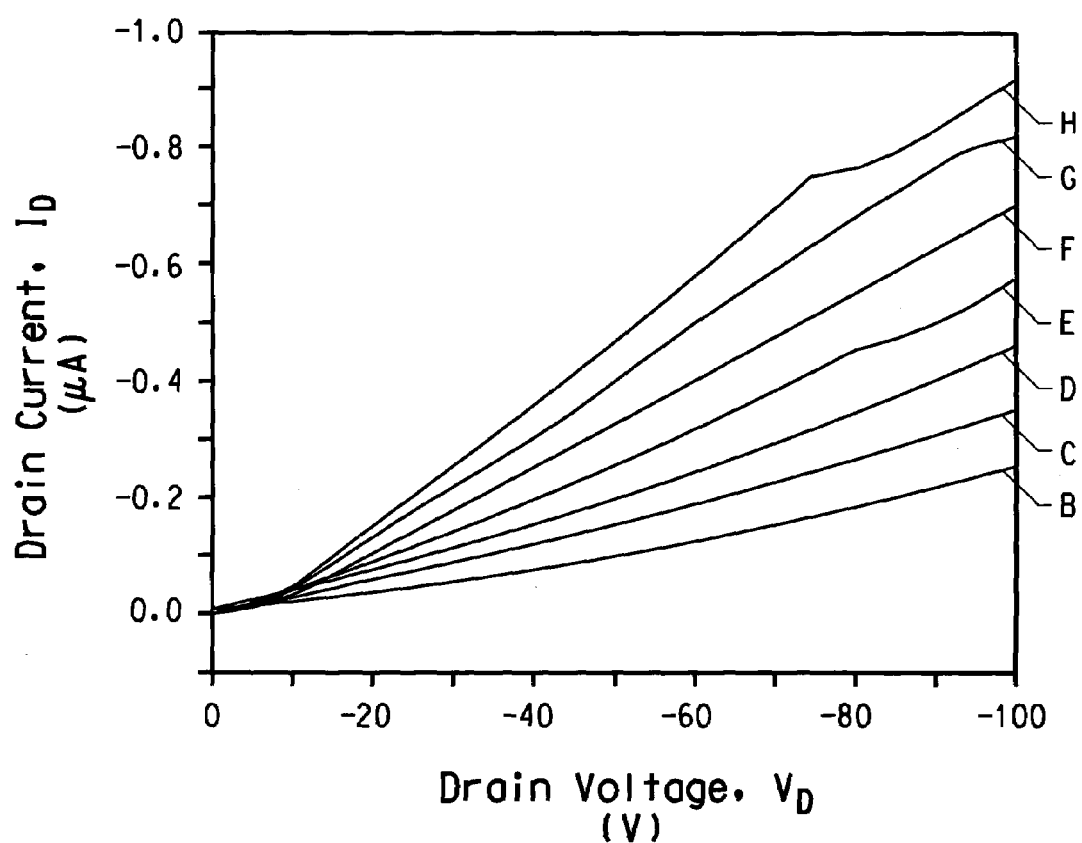
FIG. 4 is a graph of the IV characteristics of a printed transistor.
Figure 5:
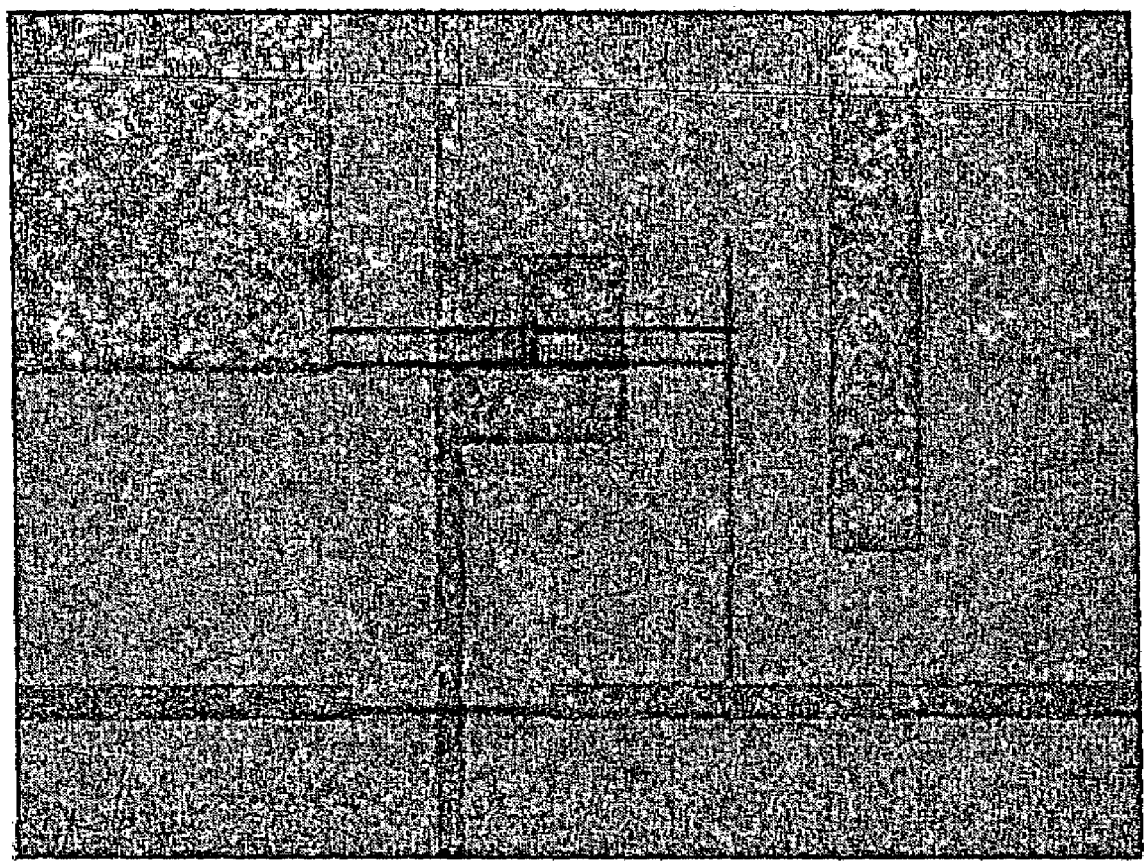
FIG. 5 is a scanned image of a printed transistor.

The IV characteristics of one of the printed transistors are shown in, FIG. 4 for gate voltages ranging from 0 to −100 V and Vsd in the same range. A scanned image of the printed transistor is also shown in FIG. 5.

What is claimed is:

1. A process comprising:
    a. forming a donor element comprising:
        i. a substrate; and
        ii. a transfer layer, wherein the transfer layer comprises a first layer and a second layer, the first layer comprises a material selected from organic semi-conductors, inorganic semi-conductors, light-emitting polymers, and light-emitting small molecules, and the second layer comprises a protective layer comprising a dielectric material selected from the group consisting of polyhydroxystyrene, polyvinylphenol, polyvinylpyridine, glass resin, fluorinated copolymers and methacrylic copolymers located between the substrate and the first layer;
    b. placing the transfer layer of the donor element in contact with a receiver element; and
    c. exposing selected areas of the donor element to laser radiation wherein the transfer layer of the donor element is transferred onto the reciever element to form a positively imaged, patterned multilayer structure.

2. The process of claim 1, wherein the donor element further comprises an ejection layer between the transfer layer and the substrate.

3. The process of claim 2, wherein the ejection layer comprises an organic material with a decomposition temperature less than 275° C.

4. The process of claim 3, wherein the ejection layer is selected from the group consisting of nitrocellulose, polyvinylchloride, chlorinated polyvinylchloride, polymethylmethacrylate and polymethylmethacrylate copolymers.

5. The process of claim 2, wherein the ejection layer further comprises a radiation-absorbing dye.

6. The process of claim 5, wherein the radiation absorbing dye is an infrared-absorbing dye.

7. The process of claim 6, wherein the infrared-absorbing dye is selected from the group consisting of 2-[2-[2-chloro-3-[(1,3-dihydro-1,3,3-trimethyl-2H-indol-2-ylidene)ethylidene]-1-cyclopenten-1-yl]ethyenyl]-1,3,3-trimethyl-3H-indolium, salt with trifluoromethane sulfonic acid(1:1); 2-[2-[2-chloro-3-[[1,3-dihydro-1,1-dimethyl-3-(4-sulfobutyl)-2H-benz[e]indol-2-ylidene]ethylidene]-1-cyclohexen-1-yl]ethenyl]1,1-dimethyl-3-(4-sulfobutyl)-1H-benz[e]indolium, inner salt, free acid; and 4-[[3-[[2,6-bis(1,1-dimethylethyl)-4H-thiopyran-4-ylidene]methyl]-2-hydroxy-4-oxo-2-cyclobuten-1-ylidene]methyl]-2,6-bis(1,1-dimethylethyl)-thiopyrylium, inner salt.

8. The process of claim 1, wherein the substrate of the donor element is a flexible film.

9. The process of claim 8, wherein the flexible film comprises a polymer selected from the group consisting of polyesters, polyether sulfone, polyvinyl chloride, polyimides, poly(vinyl alcohol-co-acetal), polyethylene, and cellulose esters.

10. The process of claim 1, wherein the fragile or thermally sensitive material comprises an organic electroactive material.

11. The process of claim 10, wherein the organic electroactive material comprises a light-emitting polymeric material or a light-emitting small molecule.

12. The process of claim 11, wherein the anode layer comprises indium tin oxide.

13. A polymer light-emitting diode manufactured according to the process of claim 12.

14. The process of claim 1, wherein the fragile or thermally sensitive material comprises an organic or inorganic semiconductor and the protective layer comprises a dielectric material.

15. The process of claim 14, wherein the organic semiconductor is selected from the group consisting of pentacene, sexithiophene, tetracene, polythieneylenevinylene, thiophene oligomers, benzothiophene dimers and polyacetylenes.

16. The process of claim 14, wherein the receiver element comprises a substrate and a patterned conductive layer.

17. The process of claim 16, wherein the substrate of the receiver element comprises mineral-filled polyester, ivory paper or spunbonded polyolefin.

18. The process of claim 14, wherein the receiver element further comprises an adhesive layer.

19. The process of claim 18, wherein the adhesive layer comprises a polymer selected from the group consisting of polycarbonates; polyurethanes; polyesters; polyvinylchloride; styrene/acrylonitrile copolymers; poly(caprolactone); vinylacetate copolymers with at least one of ethylene and vinyl chloride; (meth)acrylate homopolymers; (meth)acrylate copolymers; and mixtures thereof.

20. The process of claim 14, wherein the donor element further comprises an ejection layer between the transfer layer and the substrate.

21. The process of claim 14, wherein the donor element further comprises a heating layer between the substrate and the transfer layer.

22. The process of claim 21, wherein the heating layer comprises a thin layer of Ni, Al or Cr.

23. The process of claim 16, wherein the patterned conductive layer comprises source and drain for a transistor.

24. The process of claim 23, wherein the patterned conductive layer further comprises interconnects.

25. A thermally imageable donor element, comprising:
a. a substrate;
b. a heating layer;
c. a transfer layer comprising a first layer and a second layer, the first layer comprises a material selected from organic semi-conductors, inorganic semiconductors, light-emitting polymers, and light-emitting small molecules, and the second layer comprises a protective layer comprising a dielectric material selected from the group consisting of polyhdroxystyrene, polyvinylphenol, polyvinylpyridine, glass resin, fluorinated copolymers and methacrylic copolymers located between the substrate and the first layer.

26. The thermally imageable donor element of claim 25, wherein;

the substrate is a flexible film comprising a polymer selected from the group consisting of polyesters, polyether sulfone, polyvinyl chloride, polyimides, poly (vinyl alcohol-co-acetal), polyethylene, and cellulose esters;

the heating layer comprises a thin layer of Ni, Al, or Cr;

the protective layer comprises a dielectric material; and the transfer layer.

27. The donor element of cliam 26, wherein the first layer of the transfer layer is deposited on the second layer of the transfer layer via evaporation or casting from solution.

* * * * *

UNITED STATES PATENT AND TRADEMARK OFFICE
CERTIFICATE OF CORRECTION

PATENT NO. : 7,316,874 B2  Page 1 of 1
APPLICATION NO. : 10/807363
DATED : January 8, 2008
INVENTOR(S) : Graciela Beatriz Blanchet-Fincher It is certified that error appears in the above-identified patent and that said Letters Patent is hereby corrected as shown below:

Column 5, line 55; "flurorinated" should read --fluorinated--
Column 8, line 32; "Åif" should read --Å if--

Signed and Sealed this

Seventeenth Day of June, 2008

JON W. DUDAS
*Director of the United States Patent and Trademark Office*